(12) United States Patent
Nassar et al.

(10) Patent No.: US 10,075,195 B2
(45) Date of Patent: Sep. 11, 2018

(54) ELECTRONIC SYSTEM WITH VITERBI DECODER MECHANISM AND METHOD OF OPERATION THEREOF

(71) Applicant: Samsung Electronics Co., Ltd., Suwon-si, Gyeonggi-Do (KR)

(72) Inventors: Marcel Nassar, San Diego, CA (US); Mostafa El-Khamy, San Diego, CA (US); Inyup Kang, San Diego, CA (US); Jungwon Lee, San Diego, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 50 days.

(21) Appl. No.: 14/706,388

(22) Filed: May 7, 2015

(65) Prior Publication Data

US 2016/0065245 A1 Mar. 3, 2016

Related U.S. Application Data

(60) Provisional application No. 62/043,483, filed on Aug. 29, 2014.

(51) Int. Cl.
*H03M 13/03* (2006.01)
*H03M 13/41* (2006.01)
*H03M 13/39* (2006.01)

(52) U.S. Cl.
CPC ....... *H03M 13/413* (2013.01); *H03M 13/395* (2013.01); *H03M 13/4107* (2013.01); *H03M 13/4115* (2013.01)

(58) Field of Classification Search
CPC ............. H03M 13/41; H03M 13/4107; H03M 13/6502; H03M 13/3961; G11B 20/10009
USPC .......................................................... 714/795
See application file for complete search history.

(56) References Cited

U.S. PATENT DOCUMENTS

| 5,905,742 | A  | * | 5/1999  | Chennakeshu ....... H03M 13/41 375/222 |
| 6,877,132 | B1 | * | 4/2005  | De ........................ H03M 13/23 714/795 |
| 8,230,313 | B2 |   | 7/2012  | Abdallah et al. |
| 8,433,004 | B2 | * | 4/2013  | Kosakowski ....... H03M 13/413 375/262 |
| 8,438,463 | B2 | * | 5/2013  | Wu ..................... H03M 13/413 714/795 |
| 8,548,102 | B2 |   | 10/2013 | Doan et al. |
| 8,549,386 | B2 |   | 10/2013 | Lu et al. |
| 8,718,201 | B2 |   | 5/2014  | Lane et al. |
| 8,762,822 | B2 |   | 6/2014  | Lane et al. |
| 8,904,266 | B2 | * | 12/2014 | Tang ................. H03M 13/4107 714/795 |

(Continued)

*Primary Examiner* — Albert Decady
*Assistant Examiner* — Enam Ahmed
(74) *Attorney, Agent, or Firm* — Perspectives Law Group, Corp.

(57) ABSTRACT

A electronic system includes: a support chip configured to receive an input code stream; a circular Viterbi mechanism, coupled to the support chip, configured to: generate a final path metric for the input code stream, store intermediate path metrics at the repetition depth, generate a repetition path metric for the input code stream, and calculate a soft correlation metric based on the final path metric, the repetition path metric, and the intermediate path metrics.

19 Claims, 5 Drawing Sheets

(56) References Cited

U.S. PATENT DOCUMENTS

| | | | |
|---|---|---|---|
| 8,938,035 B1* | 1/2015 | Dai | H04L 1/0054 375/341 |
| 2003/0133514 A1* | 7/2003 | Lais | H04N 5/4401 375/260 |
| 2005/0044327 A1* | 2/2005 | Howard | G06F 9/544 711/147 |
| 2009/0323868 A1* | 12/2009 | Alt | H03M 13/3738 375/343 |
| 2011/0182385 A1 | 7/2011 | Doan et al. | |
| 2014/0013191 A1 | 1/2014 | Gong | |

* cited by examiner

ELECTRONIC SYSTEM WITH VITERBI DECODER MECHANISM AND METHOD OF OPERATION THEREOF

CROSS REFERENCE TO RELATED APPLICATION(S)

This application claims the benefit of U.S. Provisional Patent Application Ser. No. 62/043,483 filed Aug. 29, 2014, and the subject matter thereof is incorporated by reference herein.

TECHNICAL FIELD

An embodiment of the present invention relates generally to an electronic system, and more particularly to a system for communication processing by electronic systems.

BACKGROUND

Modern electronic systems rely on rapid signal processing for improving the communication capabilities of system users. The integrated circuit development process has made great strides to provide circuits improve the signal processing capabilities of the electronic systems. The electronic systems can include cellular telephones, WIFI connected computer systems, wireless remote control devices, electronic test equipment, wireless routers, or radio communication systems.

In order to optimize the signal processing many algorithms have been proposed. A circular Viterbi algorithm (CVA) is a suboptimal algorithm that is typically used in practice for decoding a tail-biting convolutional code (TBCC). In CVA, the Viterbi algorithm is applied to a sequence of repeated communication blocks, for applications where the information is transmitted repeatedly in a block form. This technique transfers all available soft information from the previous decoding attempt to the next iteration in order to refine the decoding process.

Some implementations of the CVA can be hardware intensive. The implementation can be logic and memory intensive. The cost of implementation can eliminate many applications that could benefit from the signal processing performance.

Thus, a need still remains for electronic system with Viterbi decoder mechanism to improve signal processing capabilities and improve communication reliability. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides an electronic system including a support chip configured to receive an input code stream; a circular Viterbi mechanism, coupled to the support chip, configured to: generate a final path metric for the input code stream, store intermediate path metrics at the repetition depth, generate a repetition path metric for the input code stream, and calculate a soft correlation metric based on the final path metric, the repetition path metric, and the intermediate path metrics.

An embodiment of the present invention provides a method of operation of an electronic system including: receiving an input code stream; generating a final path metric, for the input code stream, with a circular Viterbi mechanism; storing intermediate path metrics at the repetition depth when decoding with the circular Viterbi mechanism; generating a repetition path metric for the input code stream; and calculating a soft correlation metric based on the final path metric, the repetition path metric, and the intermediate path metrics.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
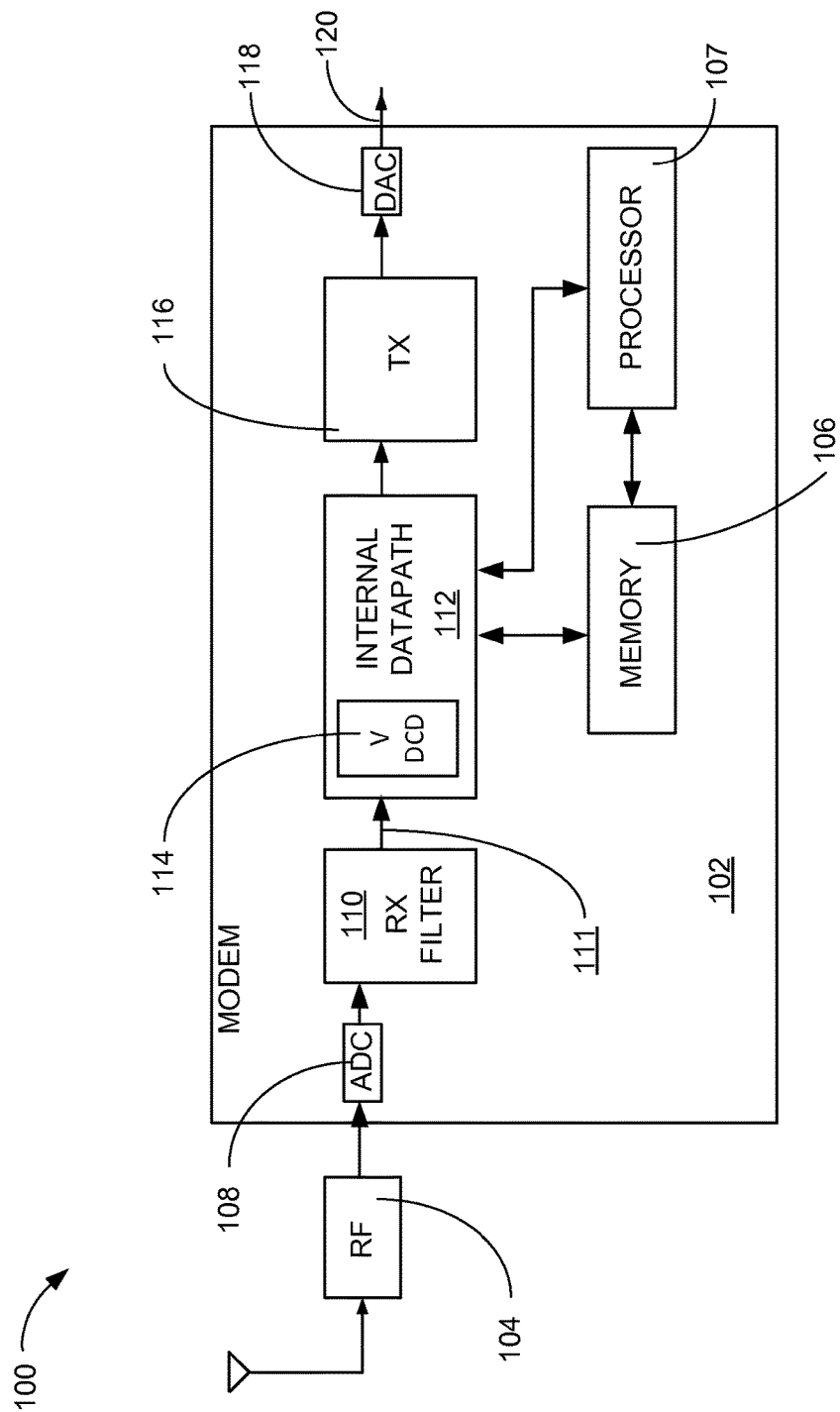
FIG. 1 is an electronic system with Viterbi decoder mechanism in an embodiment of the present invention.

Various embodiments provide an electronic system with Viterbi decoder that can be integrated in any type of communication integrated circuit. Embodiments can provide a higher performance for a circular decoding without replicating the received data blocks before applying the Viterbi algorithm. During the forward Viterbi operation, the branch metrics of the repetition stages are added to the path metric (PM) used for decoding the data. As a result, the final PM is equal to the soft correlation metric (SCM) plus a predetermined offset term corresponding propagation delay attributed to the portion of the path that belongs to the repetition stages.

Various embodiments provide circular decoders that are fixed-point (i.e. they have a limited number of bits available for representing the PM). As a result, if the length of the codeword is long enough, overflow is unavoidable. Using modulo normalization addresses this issue for finding the maximum likelihood (ML) path; however, for SCM computation, overflow could result in a significantly lower value.

Various embodiments utilize a Radix-4 trellis to increase the throughput of the circular decoder. In an example, two radix-2 stages are combined to form one radix-4 stage. While the radix-4 trellis does not affect the final PM, it can complicate the traceback process and the SCM compensation for the training stage in tail-biting convolutional code (TBCC) Viterbi decoders with odd information bit sizes.

Various embodiments can modify the circular Viterbi decoder with extra hardware complexity to generate a list of codewords at the final stage, rather than one codeword.

When performing list Viterbi decoding, the circular Viterbi decoder produces a list of K candidates. The PM (thereby SCM) of these candidates are related through the differential path metric computed during the forward iteration of the list decoder. This fact can be exploited to produce the SCM values of each of the candidate codewords.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

The term "module" referred to herein can include software, hardware, or a combination thereof in an embodiment of the present invention in accordance with the context in which the term is used. For example, the software can be machine code, firmware, embedded code, and application software. Also for example, the hardware can be circuitry, processor, computer, integrated circuit, integrated circuit cores, a pressure sensor, an inertial sensor, a microelectromechanical system (MEMS), passive devices, or a combination thereof. Further, if a module is written in the apparatus claims section below, the modules are deemed to include hardware circuitry for the purposes and the scope of apparatus claims.

The term "unit" referred to herein is a circuit formed of hardware components, hardware circuitry, or hardware state machines used for specific functions.

Referring now to FIG. 1, therein is shown an electronic system 100 with a convolutional decoder mechanism in an embodiment of the present invention. The electronic system 100 includes an integrated circuit 102, such as a modem circuit, a communication circuit, or a receiver circuit. The integrated circuit 102 can be implemented with a very high transistor count and high speed logic.

For illustrative purposes, the electronic system 100 is described with the integrated circuit 102 as a communication device, although it is understood that the integrated circuit 102 can be different types of devices. For example, the integrated circuit 102 can also be a device for communicating images or a multi-media function. As an example, the integrated circuit 102 can be a circuit for a high definition television, a computer tablet, a computer monitor, a personal digital assistant, a cellular phone, an optical driver, an optical receiver, or a multi-media phone. In another example, the integrated circuit 102 can be utilized in a signal receiver for receiving broadcast or live stream signals, such as a television receiver, a cable box, a satellite dish receiver, or a web enabled device.

As an example, the electronic system 100 can include a first support circuit 104. The first support circuit 104 can be an interface device for the function of the integrated circuit 102. In an example embodiment, the first support circuit 104 is shown to be a radio frequency receiver unit, though it is understood that the first support circuit 104 could be a different type of device or function, such as an interface utilizing different wireless protocols or wired interface.

As an example, the electronic system 100 can include a second support circuit 106. The second support circuit 106 can be a memory device for storing intermediate results from within the integrated circuit 102. The second support circuit 106 can maintain the intermediate results of the integrated circuit 102. The integrated circuit 102 can perform normal operations in real-time while the second support circuit 106 collects the intermediate results and communication status.

As an example, the electronic system 100 can include a support processor 107, such as a processor, integrated-processor, core processor, or an application specific integrated circuit (ASIC) can be coupled to the second support circuit 106. The support processor 107 can analyze the contents of data stored in the second support circuit 106. The support processor 107 can be capable of interacting with the second support circuit 106 in order to determine any support functions of the integrated circuit 102 during real time operation.

An embodiment of the integrated circuit 102 can include an analog-to-digital converter (ADC) 108 coupled to the first support circuit 104. The ADC 108 can convert the analog signal from the first support chip 104 to a digital signal for internal operations of the integrated circuit 102. In the exemplary embodiment of the integrated circuit 102 the ADC 108 can be coupled to a receiver filter unit 110 for isolating an input code stream 111 carrying communication codewords.

The receiver filter unit 110 can be coupled to an internal data path 112, including a convolutional decoder 114, which includes the functional circuitry of the integrated circuit 102. The convolutional decoder 114 is a nonsystematic decoder that decodes the input code stream 111 where the data is not a discrete field within the received information. An example for the convolutional decoder 114 is a Viterbi decoder 114. The convolutional decoder 114, such as a fixed point list tail-biting convolutional code (TBCC) Viterbi decoder, can provide verified codewords received through the first support circuit 104.

The internal data path 112 can be coupled to a transmitter unit 116, which provides an external interface for the integrated circuit 102, through a digital-to-analog converter (DAC) 118. The DAC 118 can provide a functional output 120 for the example of the integrated circuit 102.

It is understood that the functional output 120 can be an interface for delivering the intended output of the function housed in the integrated circuit 102. By way of example, the functional output 120 can be a modem output, a video driver, an audio driver, a control function, a processor, or the like.

It has been discovered that the convolutional decoder 114 can be integrated in any type of the integrated circuit 102. The convolutional decoder 114 can provide a soft correlation metric (SCM) without incurring additional latency, required by previous implementations, by exploiting the relationship between the SCM and a path metric (PM) that is saved from the initial training of the convolutional decoder 114 and confirmed during the traceback process.

Figure 2:
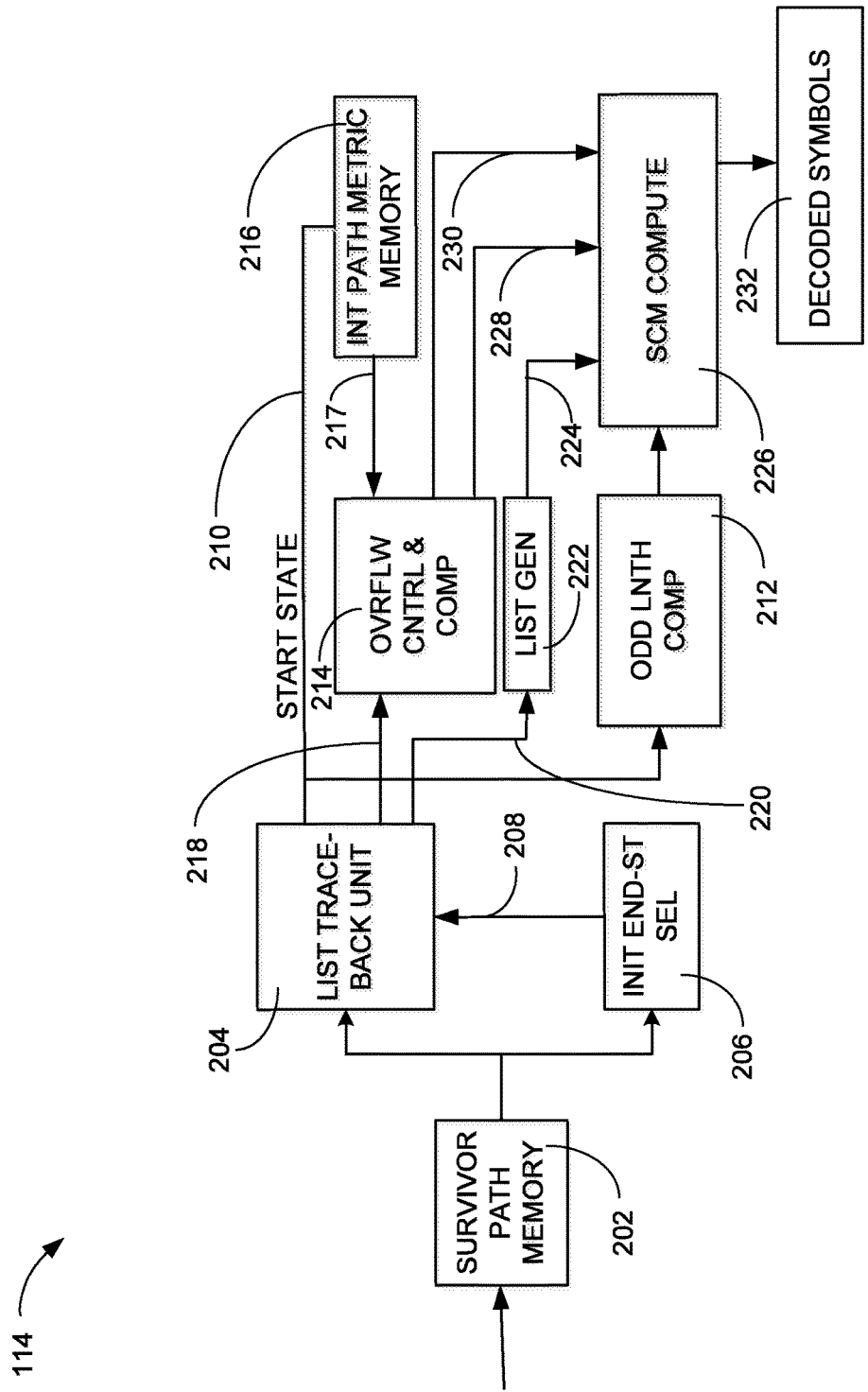
FIG. 2 is an exemplary block diagram of the Viterbi decoder in an embodiment.

Referring now to FIG. 2, therein is shown an exemplary block diagram of the convolutional decoder 114 in an embodiment. The exemplary block diagram of the convolutional decoder 114 depicts a survivor path memory 202, which can maintain a list of the survivor path overflows from previous iterations of the decoding process. As an example, the survivor path memory 202 is different from the second support circuit 106 and can be implemented as a register array in order to accommodate the timing requirements of the convolutional decoder 114.

The survivor path memory 202 can be coupled to a list trace-back unit 204 and an initial end-state select unit 206. As an example, at the initial end-state select unit 206 can be implemented within the list trace-back unit 204, but for ease of explanation they are shown as separate units. The initial end-state select unit 206 interprets the output of the survivor path memory 202 from the previous codeword. A state 0 output 208 can set an initial trace-back level for the list trace-back unit 204.

The list trace-back unit 204 can source a start state output 210, such as to an odd length compensation unit 212, an overflow control and compensation unit 214, and an intermediate path metric (PM) memory unit 216. As an example, the intermediate PM memory unit 216 can be implemented as a register array in order to meet the performance requirements of the convolutional decoder 114. A path metric bus 217 can be coupled between the intermediate PM memory unit 216 and the overflow control and compensation unit 214 for monitoring possible overflow of the calculation of the signal decodes.

The list trace-back unit 204 can also generate an end state & PM output 218, indicating the final path metric (PM), and the state identified at the beginning of a trace-back of the repetition depth (T−N). A path metric output 220 can provide a $\Phi_{T-N}(\cdot)$, which is the path metric output 220 at the end of the training process, and a $\Phi_T(\cdot)$, which is the path metric output 220 at the end of a trellis analysis.

As an example, a list generation unit 222 can compute the difference between the $\Phi_{T-N}(\cdot)$ and the $\Phi_T(\cdot)$ as part of the calculation of a soft correlation metric of the transferred codewords. The list generation unit 222 can generate a list theta output 224, which can be the list of codewords, for use by a soft correlation metric (SCM) compute unit 226 in order to calculate the corresponding difference metrics from the best path. The SCM compute unit 226 can receive the list theta output 224 from the list generation unit 222 as well as a compensated start PM 228 and a compensated end PM 230 from the overflow control and compensation unit 214.

The SCM compute unit 226 can calculate the a soft correlation metric of the transferred codewords by the calculation of:

$$\text{SCM} = -\Phi_T(S_{END}^F) + \Phi_{T-N}(S_{Head}^F) + \text{OFFSET} \times (-q_T(S_{End}^F) + q_{T-N}(S_{Head}^F)) + \Gamma - \theta \quad \text{Eq (1)}$$

where $\Phi_T(\cdot)$ is the PM at the end of the trellis and $\Phi_{T-N}(\cdot)$ is the PM right at the end of the training $S_{End}^F$ is the traceback start state in the last traceback, and $S_{Head}^F$ is the final trace-back state. The compensation parameters depend on the particular fixed-point implementation and are given by: $q_k(j)$ is the number of overflows in the survival path metric at state j in stage k, OFFSET is a constant that depends on the time delay attributed to the largest possible representable integer for the used bit width in the fixed point implementation of the overflow control and compensation unit 214.

The convolutional decoder 114, such as a TBCC Viterbi decoder, can be modified to generate a list of candidate paths. In that case, θ can be the difference between accumulated path metrics of the best path and other candidate paths. This embodiment also provides a method to compensate for θ. Γ is an offset, such as a hardware shift or skew value, that depends on the particular hardware mapping of LLR values from the list trace-back unit 204. Since all the parameters of this equation are readily available after traceback has completed, it can be computed immediately without any additional delay due to re-encoding as is required by other implementations of the Viterbi Algorithm (VA). By utilizing the relationship identified in equation 1 during the training cycle, the branch metrics of the repetition stages are added to the PM used for decoding the data. As a result, the final PM is equal to the SCM plus the offset term corresponding to the portion of the path that belongs to the repetition stages.

An embodiment can compensate for circular decoding of the convolutional decoder 114. The fixed point TBCC convolutional decoder 114 does not require the replication of the received data blocks before applying the Viterbi algorithm. During the forward Viterbi operation, the branch metrics of the repetition stages are added to the PM used for decoding the data. As a result, the final PM is equal to the SCM plus a fixed offset term corresponding to the portion of the path that is attributed to the repetition stages.

One of many possible embodiments can compensate for the PM overflow normalization. The TBCC convolutional decoder 114 is fixed-point. That is to say, there are a limited number of bits available for representing the PM. As a result, if the length of the codeword is long enough, overflow is unavoidable. The TBCC convolutional decoder 114 can use modulo normalization to address this issue for finding the most likely path. However, for SCM computation, the overflow compensates for PM value since otherwise it would be smaller and incorrect value to use in SCM computation.

An embodiment can utilize a Radix-4 trellis to increase the throughput of the TBCC convolutional decoder 114. The Radix-4 trellis doesn't affect the final PM, but it complicates the trace-back process and the SCM compensation for the training stage in TBCC convolutional decoder 114 with odd information bit sizes. This has been addressed buy the inclusion of the odd length compensation unit 212, which minimizes the burden on the SCM compute unit 226.

An embodiment of the electronic system 100 of FIG. 1 can provide a list of codewords at the final stage, rather than one codeword. The low complexity of the embodiment for list TBCC decoding, allows the TBCC convolutional decoder 114 to be modified with minimal extra hardware complexity to generate a list of the codewords at the SCM compute unit 226. In an embodiment the TBCC convolutional decoder 114 can support compensation for differential path metrics for list TBCC Viterbi decoding. The TBCC convolutional decoder 114 can produce a list of K candidates of the codewords. The SCM of the list of the K candidates can be related through the differential path metric computed during the forward iteration of the TBCC convolutional decoder 114.

As an example, the SCM compute unit 226 can receive a compensated start path metric 228 and a compensated end path metric 230, for each of the codewords identified by the SCM compute unit 226, from the overflow control and compensation unit 214. The SCM compute unit 226 can then calculate a decoded codeword 232 for processing by the internal data path 112 of FIG. 1.

An embodiment of the TBCC convolutional decoder 114 can calculate a differential path metric (DPM) by:

$$\Phi_t(i) = \max_{j \in J_{i,t}} [\Phi_{t-1}(j) + M_t(j,i)] - \max_{j \in J_{i,t} \setminus \xi_t(i)} [\Phi_{t-1}(j) + M_t(j,i)]$$  Eq (2)

For values of i and t where: $1 \leq i \leq S$ and $T-L+1 \leq t \leq T$. The second most likely path to path P is the path which diverges once from P and re-merges again at stage which has the minimum along the path P. Any path leading to stage T–N is allowed, and the path P need not terminate at the zero state. There is no limitation on the divergence stage i can be chosen according to:

$$t_{div(P,1)} = \arg \min_{T-N < t \leq T} [\theta_t(i), i \in P]$$  Eq (3)

In an embodiment the list trace-back unit 204 can identify the divergent state t, and stage i, where this state is chosen, then continues with normal trace-back at subsequent stages. The list trace-back unit 204 can extend to additional lists that can approximate most likely paths to the best path by picking the divergence stage to be that with the second (third, fourth) minimum DPM along the best path by $$t\_(div(P,2)) = \arg \min T-L < t \leq T, t \neq t_{div(P,1)} [\theta_t(i), i \in P]$$  Eq (4)

Where $\theta$ is the differential path metric of the state at which an LVD path diverged from the initial best path P. The value of $\theta$ can be subtracted from the value of the SCM in order to provide:

$$SCM_{compensated} = SCM - \theta$$  Eq (5)

It has been discovered that the electronic system 100 of FIG. 1 can provide a fixed point list TBCC convolutional decoder 114 for single ended or differential paths that can manage even or odd transfer lengths. The use of the Radix-4 trellis can provide high throughput to the internal data path 112.

It is understood that the partitioning of the hardware of the convolutional decoder 114 is an example only and other partitions are possible. For example, the odd length compensation unit 212 can be included in the SCM compute unit 226 without changing the operational aspects of the embodiment.

Figure 3:
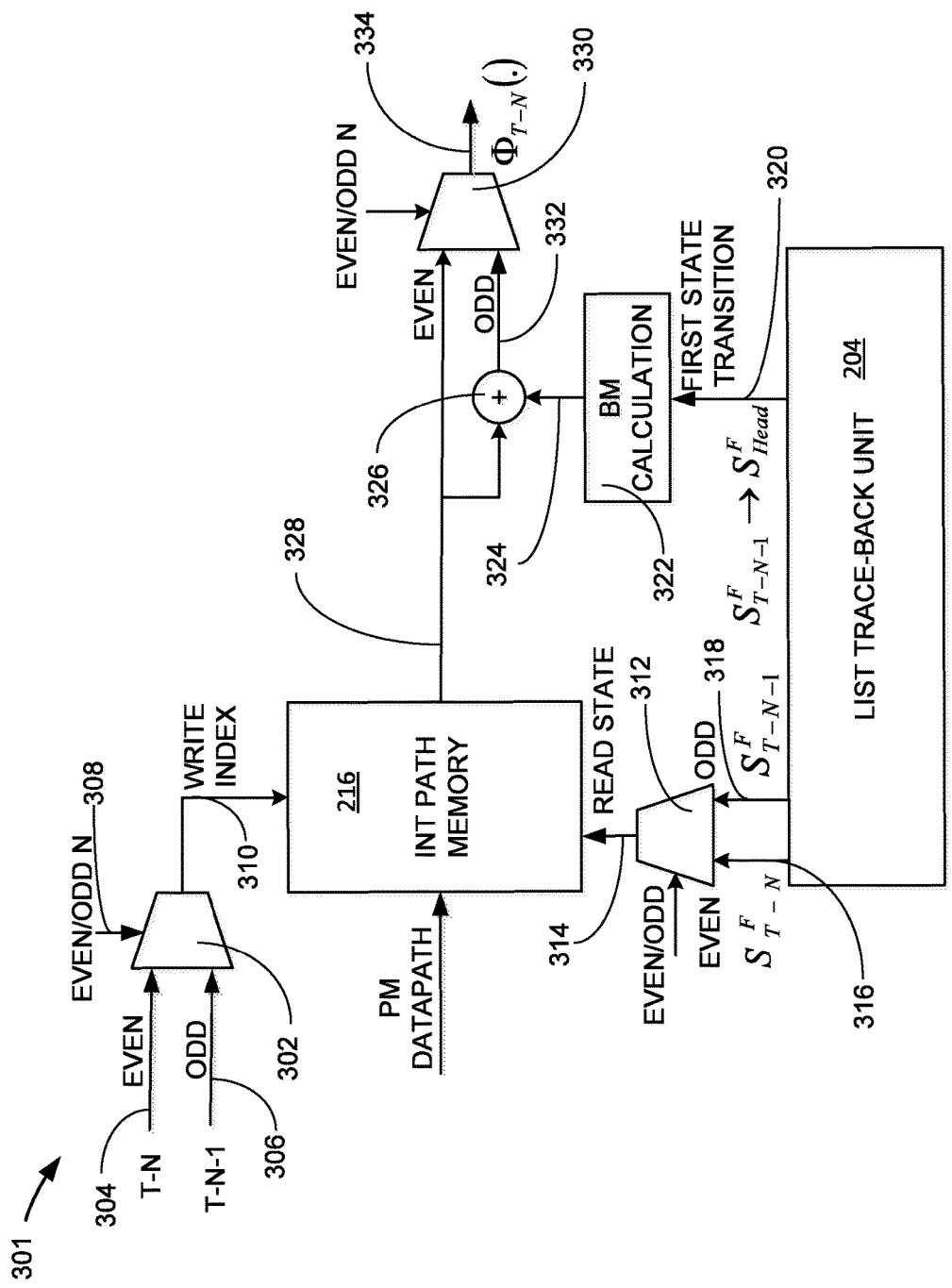
FIG. 3 is an exemplary block diagram of an odd length compensation block in an embodiment.

Referring now to FIG. 3, therein is shown an exemplary block diagram of an odd length compensation block 301 in an embodiment. The exemplary block diagram of the odd length compensation block 301 depicts a write index multiplexer 302 having an even input (T–N) 304 and an odd input (T–N–1) 306. The write index multiplexer 302 can be switched by an even/odd control line 308. The even/odd control line 308 can be generated by the length of the input information bits received in the input message. The write index multiplexer 302 can generate a write index control 310 that is coupled to the PM memory unit 216.

A read state multiplexer 312 can be coupled to the PM memory unit 216 for providing a read start state 314. The read state multiplexer 312 can select an even start state $(S_{T-N}^F)$ 316 or an odd start state $(S_{T-N-1}^F)$ 318 as the read start state 314. Both the even start state $(S_{T-N}^F)$ 316 or an odd start state $(S_{T-N-1}^F)$ 318 can be sourced from the list trace-back unit 204. The read state multiplexer 312 can be controlled by the even/odd control line 308. When operating on an odd length message both the write index multiplexer 302 and the read state multiplexer 312 will reference the odd side input, such as the odd input (T–N–1) 306 or the odd start state $(S_{T-N-1}^F)$ 318.

The list trace-back unit 204 can generate a first transition state $(S_{T-N-1}^F \rightarrow S_{Head}^F)$ 320 representing the PM right after the training stage. The first transition state $(S_{T-N-1}^F \rightarrow S_{Head}^F)$ 320 can be used by a branch metric calculation unit 322 for calculating the PM for the final trellis state of the Radix-4 trellis. The output of the branch metric calculation unit 322 is a scaled odd bit PM 324 representing the odd bit of the input message segment. An offset adder 326 can receive the scaled odd bit PM 324 and a current step PM 328 representing the even input of a length adjusted multiplexer 330. The offset adder 326 can source an adjusted step PM 322 to the odd input of the length adjusted multiplexer 330. The adjusted step PM 322 can be calculated by:

$$\Phi_{T-N}(S_{Head}^F) = \Phi_{T-N-1}(S_{T-N-1}^F) + BM(S_{T-N-1}^F \rightarrow S_{Head}^F)$$  Eq (6)

A length compensated PM 334 represented by $\Phi_{T-N}(\cdot)$ can be sourced from the length adjusted multiplexer 330 based on the even/odd control line 308. In order for the decoding process to be complete, the $S_{End}^F$ must be equal to the $S_{Head}^F$.

It has been discovered that the length compensated PM 334 represented by $\Phi_{T-N}(\cdot)$ can be implemented in a hardware structure that can accommodate both odd and even length messages. The length compensated PM 334 can pass the real-time calculated results to the SCM compute unit 226 of FIG. 2 for decoding the codewords 232 of FIG. 2.

Figure 4:
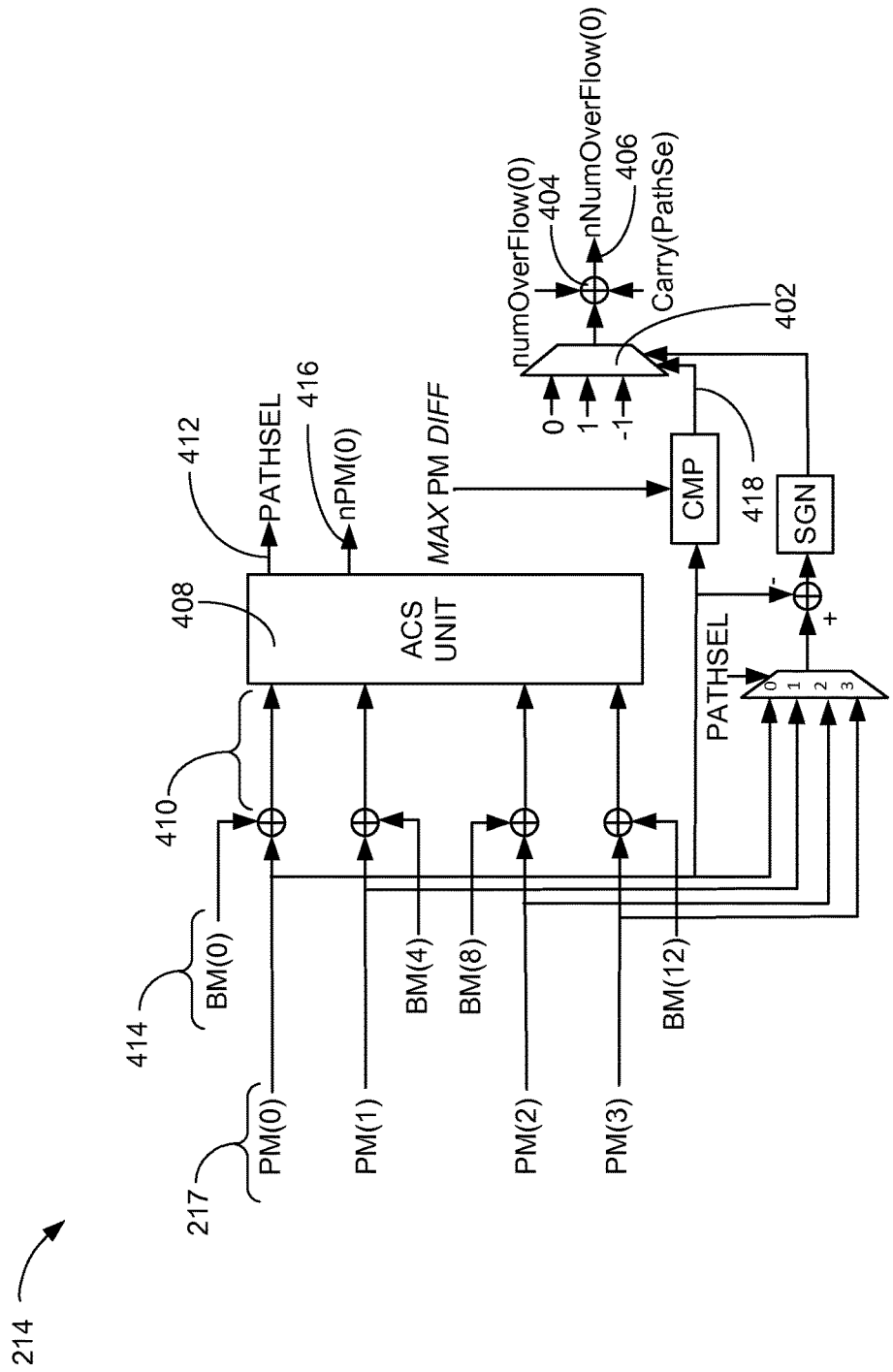
FIG. 4 is an exemplary block diagram of the overflow control and compensation unit in an embodiment.

Referring now to FIG. 4, therein is shown an exemplary block diagram of the overflow control and compensation unit 214 in an embodiment. The exemplary block diagram of the overflow control and compensation unit 214 depicts an overflow normalization multiplexer 402 and an overflow control adder 404 can provide a normalized overflow count 406.

The example embodiment can assume the property of all path metrics will be within max$\Delta$PM of each other, knowing the overflow of one path metric will allow the overflow of the remaining path metrics to be determined. Overflow control for modulo normalization can be calculated using only one overflow counter, without loss of generality, the counter to track the overflow in the PM for surviving path entering state 0, can be represented by $\Phi_j(0)$.

As an example, a path might diverge to another state in the next stage of the Radix-4 trellis, thus the path metric stored at state 0 might refer to a different path than the one that has been tracked by the overflow counter. As a result, the new path metric at state 0 must compute the number of overflows of the survival path that will end in state 0 at the following stage t+1. This number of overflows at stage t can be computed from $q_t(0)$ as follows, with the assumption that the surviving path metric originates from state 1 at stage t:

$$q_t(l) = \begin{cases} q_t(0) + 1 & \text{if } \Phi_t(l) > \Phi_t(0) \text{ and } \Phi_t(0) \geq \max\Delta PM \quad \text{Eq (7)} \\ q_t(0) - 1 & \text{if } \Phi_t < \Phi_t(0) \text{ and } \Phi_t(0) < \max\Delta PM \\ q_t(0) & \text{otherwise} \end{cases}$$

If the surviving path is at state 1 of stage t, the new path metric at state 0 of stage t+1 is given by:

$$\Phi_{t+1}(0) = \Phi_t + M_t(l,0)$$  Eq (8)

where the addition is using a circular adder. The most significant bit carry c is added on $q_t(1)$ to form $q_{t+1}(0)$ as follows:

$$q_{t+1}(0) = q_t(l) + c.$$  Eq (9)

Keeping track of the overflow for state 0's path metric requires modification of the circuit around an add-compare-select (ACS) unit 408 that computes the state 0's path metric. The branch metric computation is part of the Viterbi decoder core that goes into the Accumulate compare and select unit (ACS). This is part of the Viterbi algorithm that basically correlates the input LLR with the possible output bits resulting for each trellis transition. The (BM(x)) bus 414 is part of the convolutional decoder 114 of FIG. 1 and precedes the computations done in the survivor path memory 202.

The ACS unit 408 can analyze a combination metric bus 410 for determining the most likely path as reflected by a path select bus 412. The combination metric bus 410 can be formed by the combination of the path metric bus 217 and a branch metric bus 414. The combination metric bus 410 can be formed by adders used to combine the bits of the path metric bus 217 with the appropriate bits of the branch metric bus 414.

The ACS unit 408 can calculate the initial state of the received signal for decoding the received codeword. The initial path metric state (nPM(0)) 416 can be used to determine the successful decoding of the codewords 232 of FIG. 2 by checking CRC results of the output most likely of the codewords 232.

A local path metric difference 418 can be generated by comparing the PM(0) value of the path metric bus 217 to the MAX PM DIFF (4XX). The term "numOverFlow(0)" is the number of overflows of the path metric stored in register PM(0) it represents the q_x (0) in equation (1). For modulo normalization, since the number of overflow is strictly bounded between the variables, it is the only variable needed for doing overflow compensation in the overflow control and compensation unit 214.

The term "Carry(PathSe)" is the result of the addition operation of the PM(x) of the path metric bus 217 and BM(x) of the branch metric bus 414. By way of an example, this embodiment can have 4 such carries. Each of the carry bits can be either 0 or 1 depending on whether the result of that addition has produced an overflow. Since the ACS unit 408 will select one of those paths given by PATHSEL, Carry(PathSE) is the carry associated with only that selected path.

The term "MAX PM DIFF" is an implementation constant that depends on the bit width used to represent the path metric bus 217. By way of am example and for ease of discussion the path metric bus 217 is shown having 4 bits but a different number of bits can be implemented. For example, the MAX PM DIFF can be $2^{M-1}$, where M is the bit width of the path metric bus 217.

The SGN block, in the overflow path, reflects the sign of the difference between the PM(0) bit and the selected bit from the path metric bus 217, which can either be +1 or −1. The select line from the SGN block and the comparator result from CMP will select a constant offset of either 0, +1, or −1 to add to the initial path metric state (nPM(0)) 416.

Figure 5:
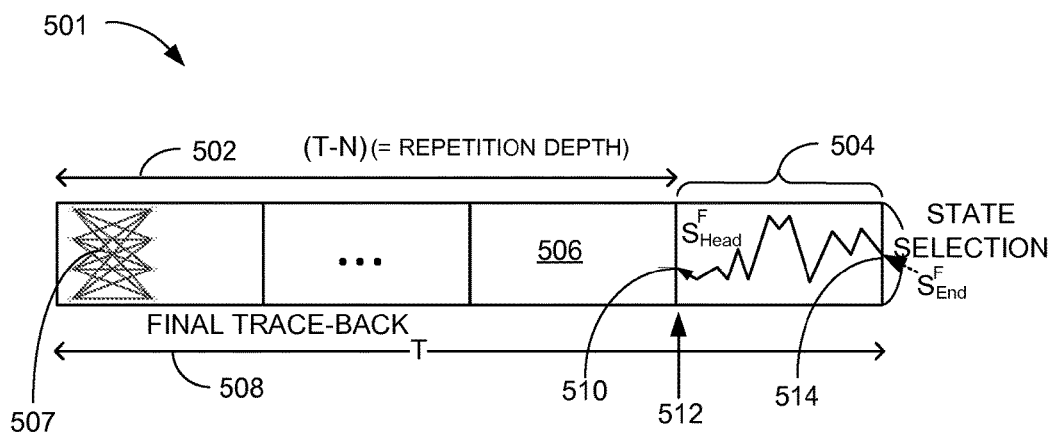
FIG. 5 is an exemplary transmission sequence as processed by the Viterbi decoder in an embodiment.

Referring now to FIG. 5, therein is shown an exemplary functional diagram of a transmission sequence 501 as processed by the convolutional decoder 114 of FIG. 1 in an embodiment.

The decoding of TBCC requires that the starting state and the end state must agree. This leads to optimal most likely (ML) decoding that grows exponentially in the intermediate PM memory unit 216 of FIG. 2.

The decoding of TBCC provides the circular Viterbi algorithm (CVA) terminates at a repetition depth (T−N) 502, the final PM 504 will contain the aggregate of metrics from the repetition stages 506. Each of the repetition stages 506 is interpreted through a trellis 507, such as a radix-4 trellis for calculating the soft correlation matrix of the input code words. As a result, the relationship between the PM and SCM can be given by:

$$\Phi_T(S_T) = \Phi_{T-N}(S_{T-N}) - \Sigma_{i=1}^N llr_i c'_i \quad \text{Eq (10)}$$

where $S_i$ is the state at stage i when tracing back from the final ML state, and is the corresponding codeword resulting from a trace-back 508. Since the trace-back state 510 at stage T−N 512 is not known a-priori, an embodiment provides the use of the intermediate PM memory unit 216 to save all the PMs at the repetition depth (stage T−N) 502. The appropriate compensation for using CVA is given by:

$$SCM = -\Phi_T(S_{End}^F) + \Phi_{T-N}(S_{Head}^F) \quad \text{Eq (11)}$$

where $S_{End}^F$ is the trace-back start state 514 in the final trace-back 504, and $S_{Head}^F$ is the final trace-back state 510. Upon successful decoding of the tail-biting convolutional code, the final state 510 and the starting state 514 in the final trace-back 504 should be equal (i.e. $S_{End}^F = S_{Head}^F$).

Figure 6:
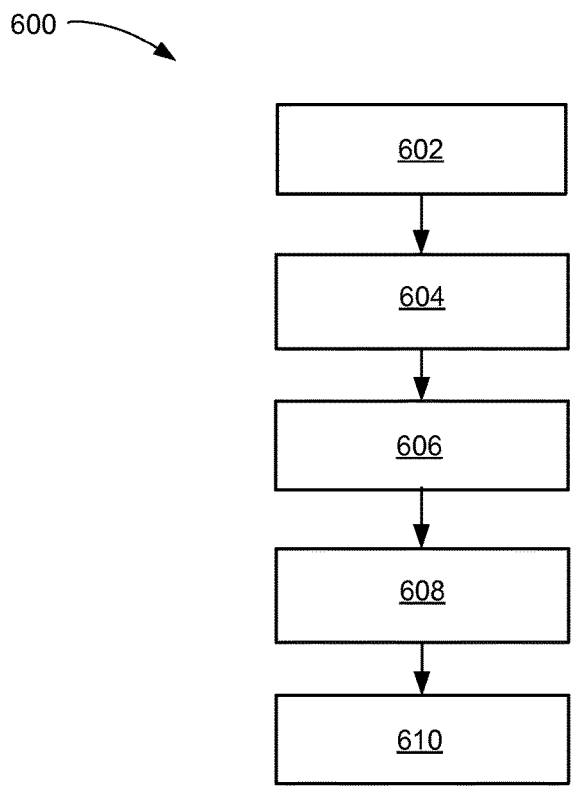
FIG. 6 is a flow chart of a method of operation of an electronic system in a further embodiment of the present invention.

Referring now to FIG. 6, therein is shown a method 600 of operation of an electronic system 100 in a further embodiment of the present invention. The method 600 includes: receiving an input code stream in a block 602; generating a final path metric, for the input code stream, with a circular Viterbi mechanism in a block 604; storing intermediate path metrics at the repetition depth when decoding with the circular Viterbi mechanism in a block 606; generating a repetition path metric for the input code stream in a block 608; and calculating a soft correlation metric based on the final path metric, the repetition path metric, and the intermediate path metrics in a block 610.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. An electronic system comprising:
   a support chip configured to receive an input code stream;
   a circular Viterbi mechanism, coupled to the support chip, including:
   a list trace-back unit configured to generate a final path metric corresponding to an end state based on the input code stream, wherein the final path metric is based on an aggregate of a plurality of intermediate path metrics each from a repetition depth;
   an intermediate path metric memory unit configured to store the plurality of intermediate path metrics, wherein the intermediate path metric memory unit generates a start path metric based on one of the plurality of intermediate path metrics that corresponds to the start state;
   an overflow control and compensation unit, including an overflow normalization multiplexer and an overflow control adder, configured to generate a normalized overflow count, wherein the overflow control and compensation unit receives the final path metric from the list trace-back unit and the start path metric from the intermediate path metric memory unit, and wherein the overflow control and compensation unit generates a compensated start path metric and a compensated end path metric; and a soft correlation metric compute unit configured to calculate a soft correlation metric based on the compensated start path metric and the compensated end path metric.

2. The system as claimed in claim 1 wherein the overflow control and compensation unit is coupled to the intermediate path metric memory unit through a path metric bus.

3. The system as claimed in claim 1 wherein the circular Viterbi mechanism includes a radix-4 stage.

4. The system as claimed in claim 1 wherein the circular Viterbi mechanism is further includes a list generation unit configured to generate a list theta output, wherein the soft correlation metric compute unit calculates the soft correlation metric based on the list theta output.

5. The system as claimed in claim 2 wherein the overflow control and compensation unit is further configured to calculate an overflow number at an end of a trellis and at the repetition depth.

6. The system as claimed in claim 1 wherein the circular Viterbi mechanism includes an odd length compensation unit configured to compensate for an odd number of the decoded codewords.

7. The system as claimed in claim 1 wherein the circular Viterbi mechanism configured to add F to compensate for a delay through an add-compare-select (ACS) unit.

8. The system as claimed in claim 1 wherein the circular Viterbi mechanism configured to calculate θ to compensate for a differential path metric of a generated list.

9. The system as claimed in claim 1 wherein the circular Viterbi mechanism includes a fixed point tail-biting convolution code (TBCC) decoder configured to generate the final path metric.

10. The system as claimed in claim 1 wherein the circular Viterbi mechanism configured to calculate the soft correlation metric with $$\Phi_T(S_{END}^F)+\Phi_{T-N}(S_{Head}^F)+\text{OFFSET}\times(-q_T(S_{End}^F)+q_{T-N}(S_{Head}^F))+\Gamma-\theta.$$

11. A method of operation of an electronic system comprising:

receiving an input code stream;

generating a final path metric corresponding to an end state based on the input code stream using a list trace-back unit, wherein the final path metric is based on an aggregate of a plurality of intermediate path metrics each from a repetition depth;

storing the plurality of intermediate path metrics using an intermediate path metric memory unit, wherein the intermediate path metric memory unit generates a start path metric based on one of the plurality of intermediate path metrics that corresponds to the start state;

generating a normalized overflow count using an overflow control and compensation unit including an overflow normalization multiplexer and an overflow control adder, wherein the overflow control and compensation unit receives the final path metric from the list traceback unit and the start path metric from the intermediate path metric memory unit, and wherein the overflow control and compensation unit generates a compensated start path metric and a compensated end path metric; and calculating a soft correlation metric using a soft correlation metric compute unit based on compensated start path metric and the compensated end path metric.

12. The method as claimed in claim 11 wherein calculating the soft correlation metric includes processing the input code stream with a radix-4 stage formed by combining two radix-2 stages.

13. The method as claimed in claim 11 wherein calculating the soft correlation metric includes generating a list theta output using a list generation unit, wherein the soft correlation metric compute unit calculates the soft correlation metric based on the list theta output.

14. The method as claimed in claim 12 wherein compensating for the overflow compensation includes calculating an overflow number at an end of a trellis and at the repetition depth.

15. The method as claimed in claim 11 wherein generating the repetition path metric for the input code stream includes compensating an odd number for decoded codewords.

16. The method as claimed in claim 11 further comprising determining F by measuring a delay through an add-compare-select (ACS) unit.

17. The method as claimed in claim 11 further comprising determining θ by measuring a differential path metric of a generated list.

18. The method as claimed in claim 11 wherein generating the final path metric includes processing using a fixed point tail-biting convolution code (TBCC) decoder.

19. The method as claimed in claim 11, wherein calculating the soft correlation metric is equal to $$\Phi_T(S_{END}^F)+\Phi_{T-N}(S_{Head}^F)+\text{OFFSET}\times(-q_T(S_{End}^F)+q_{T-N}(S_{Head}^F))+\Gamma-\theta.$$

* * * * *